US011536620B2

(12) United States Patent
McVeigh

(10) Patent No.: US 11,536,620 B2
(45) Date of Patent: Dec. 27, 2022

(54) FORCE SENSING CIRCUITRY

(71) Applicant: Cirrus Logic International Semiconductor Ltd., Edinburgh (GB)

(72) Inventor: Gavin McVeigh, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 253 days.

(21) Appl. No.: 17/011,500

(22) Filed: Sep. 3, 2020

(65) Prior Publication Data

US 2021/0072100 A1 Mar. 11, 2021

Related U.S. Application Data

(60) Provisional application No. 62/896,655, filed on Sep. 6, 2019.

(30) Foreign Application Priority Data

Jan. 9, 2020 (GB) ...................................... 2000266

(51) Int. Cl.
*G01L 1/00* (2006.01)
*G01L 1/22* (2006.01)
(52) U.S. Cl.
CPC .................................. *G01L 1/2268* (2013.01)
(58) Field of Classification Search
CPC .................................................... G01L 1/2268
See application file for complete search history.

(56) References Cited

U.S. PATENT DOCUMENTS

| | | | | |
|---|---|---|---|---|
| 4,556,805 A | * | 12/1985 | Shoji | ...................... H03K 3/011 |
| | | | | 327/327 |
| 5,477,471 A | | 12/1995 | Baum et al. | |
| 5,548,227 A | * | 8/1996 | Minami | ................. H03K 5/086 |
| | | | | 327/87 |
| 6,055,213 A | | 4/2000 | Rubbo et al. | |
| 7,598,794 B1 | * | 10/2009 | Stansell | ........... H03K 19/00315 |
| | | | | 327/434 |
| 10,224,922 B1 | * | 3/2019 | Tiwari | ........... H03K 19/018521 |
| 2002/0172295 A1 | * | 11/2002 | Dyer | ................... H04L 25/0292 |
| | | | | 375/295 |
| 2009/0153108 A1 | | 6/2009 | Hendin et al. | |
| 2010/0109661 A1 | | 5/2010 | Koski et al. | |
| 2012/0242309 A1 | | 9/2012 | Korzeniowski | |
| 2014/0021969 A1 | | 1/2014 | Tseng et al. | |

(Continued)

FOREIGN PATENT DOCUMENTS

WO 2017192465 A1 11/2017

OTHER PUBLICATIONS

Combined Search and Examination Report under Sections 17 and 18(3), UKIPO, Application No. GB2105991.0, dated Jul. 7, 2021.

(Continued)

*Primary Examiner* — Max H Noori
(74) *Attorney, Agent, or Firm* — Jackson Walker L.L.P.

(57) ABSTRACT

Circuitry for biasing a sensor comprises a bias generator module configured to receive a supply voltage and to generate a bias voltage for biasing the sensor. The circuitry further comprises a control module configured to compare a voltage indicative of the supply voltage to a threshold voltage and to output a control signal to the bias generator module based on the comparison. The bias generator module is configured to control the bias voltage based on the control signal.

31 Claims, 8 Drawing Sheets

(56) References Cited

U.S. PATENT DOCUMENTS

| | | | | |
|---|---|---|---|---|
| 2014/0119077 A1* | 5/2014 | Walters | ............... | H02M 7/06 |
| | | | | 363/89 |
| 2019/0305735 A1 | 10/2019 | Zou et al. | | |
| 2020/0387224 A1* | 12/2020 | Das | ............... | B06B 1/0207 |
| 2021/0072100 A1* | 3/2021 | Mcveigh | ............... | H03K 17/96 |
| 2021/0376934 A1* | 12/2021 | Tsai | ............... | H03G 3/3084 |

OTHER PUBLICATIONS

Examination Report under Section 18(3), UKIPO, Application No. GB2000266.3, dated Jul. 7, 2021.
International Search Report and Written Opinion of the International Searching Authority, International Application No. PCT/GB2020/052105, dated Nov. 18, 2020.
Combined Search and Examination Report under Sections 17 and 18(3), UKIPO, Application No. GB2000266.3, dated Jun. 23, 2020.
Search Report under Section 17(6), UKIPO, Application No. GB2000266.3, dated Aug. 26, 2020.

* cited by examiner

FORCE SENSING CIRCUITRY

FIELD OF THE INVENTION

The present disclosure relates to the field of force sensing circuits and systems.

BACKGROUND

Traditional portable devices (e.g. mobile phones, tablet computers, remote controllers, video game controllers, etc.) typically include mechanical buttons for a user to control the portable device. Such mechanical buttons are susceptible to wear and tear and can be vulnerable to damage and malfunction due to ingress of water, dust and/or debris. As such, manufacturers are increasingly looking to alternative solutions to facilitate interaction between a user and a portable device.

One approach to facilitating such interaction is to provide so called "virtual buttons" in the form of force sensors. A force sensor may be provided as part of a portable device in the place of a mechanical button. The force sensor may be configured to detect user interaction with the sensor (e.g. the sensor being touched or pressed) and to cause the portable device to initiate some functionality in response to the detected interaction. Such virtual buttons provide advantages over mechanical buttons, due to the absence of the moving parts of a mechanical button. This can lead to reduced wear and increased longevity of the portable device. The use of force sensors can also help to improve the water-resistance of a portable device, as mechanical buttons can provide a substantial entry point to fluids. Further, mechanical buttons are relatively large components of a portable device and therefore smaller alternatives such as force sensors can free up space for additional components. For example, in a mobile phone the additional space may be occupied by an increased number of 5G antennas.

Manufacturers are further looking to provide increased interactivity between a user and a portable device, and the use of force sensors can facilitate additional or alternative methods for a user to interact with a portable device. For example, one or more force sensors may be used to provide a "virtual slider" type function along one or more surfaces of a portable device, which may provide for an interface area of the portable device, in addition to, for example, a touchscreen. To ensure that the user experience is not drastically altered by the introduction of force sensors, the "virtual interfaces" provided by the force sensor should look and feel to a user as if a mechanical button or other mechanical interface were present instead of a virtual button or virtual button interface.

Force sensors thus detect forces on the device to determine a user interaction with the device, e.g. a touch, press or squeeze of the device. The force applied by a user will generally be of a low magnitude and as such it is beneficial for the force sensors to be configured with the maximum possible sensitivity in order to detect user interaction.

Another important consideration is that the portable device should respond in a consistent manner to user interactions, i.e. the response of the device to a particular user interaction such as a touch on a virtual button should always be the same. User experience can be degraded if such a consistent response is not maintained or the force sensor fails to detect a user interaction.

Further, portable devices commonly draw power from an on-board battery and as such there is generally a limited supply of power for such devices. The power consumption of force sensors used in portable devices should therefore be low.

There is thus a need in the industry for circuitry and systems to support force sensors, which balance the need for low power consumption with the requirement to maintain consistent and reliable sensitivity performance.

Embodiments of the present disclosure thus relate to apparatus and systems for sensing that at least mitigate at least some of the above mentioned issues.

According to a first aspect the invention provides circuitry for biasing a sensor; comprising:
  a bias generator module configured to receive a supply voltage and to generate a bias voltage for biasing the sensor; and
  a control module configured to compare a voltage indicative of the supply voltage to a threshold voltage and to output a control signal to the bias generator module based on the comparison;
  wherein the bias generator is configured to control the bias voltage based on the control signal.

The bias generator module may be operable to adjust the bias voltage from a first defined bias voltage magnitude to a second defined bias voltage magnitude based on the control signal.

The second defined bias voltage magnitude may be smaller than the first defined bias voltage magnitude and the control module may be configured to output the control signal in response to the comparison being indicative that the magnitude of the supply voltage has decreased below the threshold voltage.

The second defined bias voltage magnitude may be larger than the first defined bias voltage magnitude and the control module may be configured to output the control signal in response to the comparison being indicative that the magnitude of the supply voltage has increased above the threshold voltage.

The control module may be configured to apply a time delay prior outputting the control signal.

The time delay may be predetermined based on an expected rate of increase of the supply voltage magnitude.

The control module may be configured to monitor the supply voltage to determine whether the supply voltage magnitude is increasing or decreasing.

The control module may be configured to suspend the output of the control signal in response to the control module determining that the supply voltage magnitude is decreasing during a time delay.

The control module may be configured to not to output the control signal in response to the control module determining that the supply voltage has decreased below the voltage threshold during the time delay.

The control module may be configured to select a value of the threshold voltage based on the determination of whether the supply voltage magnitude is increasing or decreasing.

In response to the control module determining that the supply voltage magnitude is decreasing, the control module may be operative to select a first threshold voltage value.

In response to the control module determining that the supply voltage magnitude is increasing, the control module may be operative to select a second threshold voltage value, larger than the first threshold voltage value.

Alternatively, in response to the control module determining that the supply voltage magnitude is increasing, the control module may be operative to select the first threshold voltage value.

The control module may be configured to select the value of the threshold voltage based on a magnitude of the supply voltage.

The bias generator module may be configured to generate the bias voltage at a plurality of defined bias voltage magnitudes.

The circuitry may comprise a memory for storing a plurality of threshold voltage values corresponding to the plurality of defined bias voltage magnitudes and the control module may be configured to select one of the threshold voltage values of the plurality to compare to the supply voltage, based on a magnitude of the supply voltage and a determination of whether the supply voltage magnitude is increasing or decreasing.

The plurality of threshold voltage values may be predetermined based on a dropout voltage of the bias generator module.

The control module may be configured to receive a signal indicative of the bias voltage.

The control module may be configured to select a normalisation function based on the bias voltage.

The circuitry may comprise a processing module configured to receive an output signal from the sensor and further configured to receive the normalisation function from the control module; and the processing module may be configured to apply the normalisation function to the output signal to generate a normalised output signal.

The circuitry may comprise a memory comprising a plurality of normalisation functions corresponding to the plurality of defined bias voltage magnitudes and the control module may be configured to select one of the plurality of normalisation functions based on the bias voltage magnitude.

The threshold voltage may comprise the smallest magnitude value of the plurality of threshold voltage values and in response to the comparison being indicative that the supply voltage has decayed below the smallest magnitude value of the plurality of threshold voltage values the control module may be configured to control the processing module to not process the output signal.

The control module may comprise a hysteretic comparator configured to compare the supply voltage to the threshold voltage and output the control signal based on the comparison.

The control signal may comprise a latch signal.

The sensor may be a force sensor, for example.

The circuitry may be implemented as an integrated circuit.

According to a second aspect the invention provides a power supply unit comprising circuitry according to the first aspect and a battery configured to output the supply voltage.

According to a third aspect the invention provides an electronic device comprising circuitry according to the first aspect, a battery configured to output the supply voltage and a sensor configured to receive the bias voltage.

The electronic device may be a portable or battery powered device.

The electronic device may be one of: a tablet, laptop computer, smartphone or smartwatch.

According to a fourth aspect the invention provides circuitry for normalising an output signal of a force sensor comprising:

a bias generator module configured to receive a supply voltage and to generate a bias voltage for biasing the force sensor;

a control module configured to receive a voltage indicative of the bias voltage and select a normalisation function based on the bias voltage; and a processing module configured to receive the output signal and the normalisation function;

wherein the processing module is further configured to apply the normalisation function to the output signal to normalise the output signal.

According to a fifth aspect the invention provides a sensor module comprising:

a sensor;

a bias generator configured to receive a supply voltage and to generate a bias voltage for biasing the sensor; and a controller configured to compare a signal voltage indicative of the supply voltage to a threshold voltage and to output a control signal to the bias generator based on the comparison;

wherein the bias generator is configured to control the bias voltage based on the control signal.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above, force sensors present an alternative means for enabling interaction between a user and a device such as a portable device. A number of different types of force sensors have been developed in recent times. For example, resistive, inductive, capacitive, resistive-inductive-capacitive and piezo-electric force sensors have been explored as alternative means to enable user interaction. For any of these force sensors to be viable options to provide user interactivity, the force sensors should be configured so as to have an appropriate sensitivity, in use, to detect user interaction.

Figure 1:
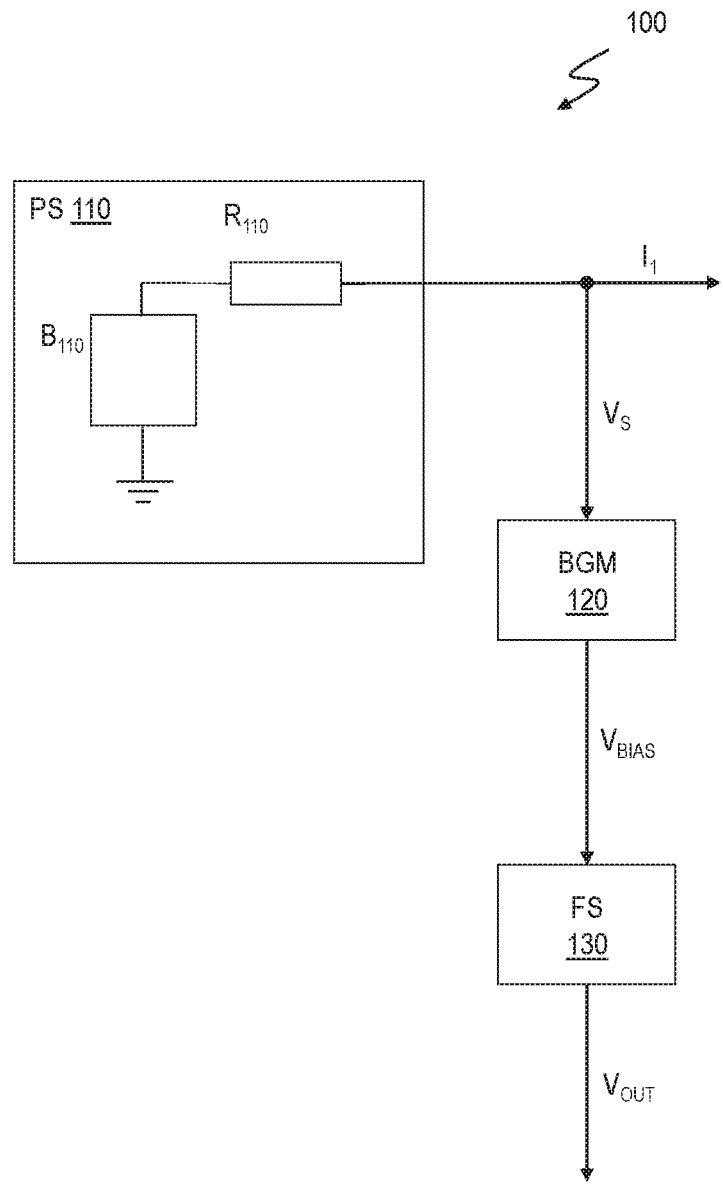
FIG. 1 illustrates an example of circuitry for biasing a force sensor.

FIG. 1 illustrates an example of circuitry 100 for biasing a force sensor 130. Circuitry 100 comprises power source (PS) 110 and bias generator module (BGM) 120. Power source 110 may comprise any suitable means for storing and supplying power such as a battery $B_{110}$. Circuitry 100 may form part of a portable electronic device and as such components of the electronic device such as a touchscreen, speaker, microphone etc. may draw current (represented in FIG. 1 by $I_1$) from the power source 110. The power source 110 will include some parasitic resistance, represented in FIG. 1 by resistance $R_{110}$. However, it will be appreciated that $R_{110}$ shown in power source 110 is for illustrative purposes and parasitic resistances that make up the "lumped resistance" $R_{110}$ may exist throughout circuitry 100 and/or an electronic device incorporating circuitry 100.

Bias generator module 120 may comprise any suitable regulator for receiving an input supply voltage $V_S$ and generating a bias voltage $V_{BIAS}$ at a defined nominal value. In one embodiment, the bias generator module 120 may comprise a linear voltage regulator. In one embodiment, the bias generator module 120 may comprise a low-dropout (LDO) regulator. Bias generator module 120 supplies the generated bias voltage $V_{BIAS}$ to force sensor 130.

The bias voltage $V_{BIAS}$ applied to the force sensor 130 establishes a reference level at which the force sensor 130 operates such that a force (e.g. touch or press) applied to force sensor 130 may generate a detectable output signal $V_{OUT}$. The output signal $V_{OUT}$ from force sensor 130 may therefore be indicative of a user interaction. $V_{OUT}$ may then be provided to downstream processing circuitry/modules, which may be configured to provide feedback to the user and/or initiate some functionality in response to $V_{OUT}$.

Bias generator 120 may typically comprise a regulator with a relatively high power supply rejection ratio (PSRR), such that any noise present in the voltage $V_S$ supplied from power source 110 is limited as much as possible by the bias generator module 120. In one embodiment, bias generator module 120 may comprise an LDO. LDOs may be configured with a relatively high PSRR, such that ripple or noise present on the supply voltage $V_S$ can be suppressed to a relatively high degree by the LDO. The PSRR of an LDO may therefore limit the amount of noise present in the supply voltage $V_S$ that passes through to the bias voltage $V_{BIAS}$. The skilled person will of course appreciate that an LDO is just one possible example of a suitable bias generator module 120 and that any voltage regulator exhibiting a suitable PSRR could also be used.

A bias generator module 120 comprising an LDO may therefore exhibit useful properties in relation to suppressing noise. However, an LDO's performance is limited by its dropout voltage. As one skilled in the art will appreciate, the dropout voltage is the minimum headroom that must be maintained between the input voltage (e.g. $V_S$) supplied to the LDO and the output voltage (e.g. $V_{BIAS}$) for reliable regulation of the output voltage. As one skilled in the art will also appreciate, any linear voltage regulator would also be subject to a similar limitation that a suitable amount of voltage headroom should be maintained between the regulator output voltage and its input voltage in order to regulate the output voltage at the expected nominal level.

In applications in which the input voltage is supplied from a consistent and fixed power source, the input voltage can be maintained at a fixed level. Therefore, with such an input voltage the headroom between the input voltage and output voltage of the LDO can be maintained such that the LDO never enters "dropout" operation.

However, in applications where the input voltage is supplied from a power source with a limited and decaying voltage, such as a battery, the difference between the input voltage and the output voltage of the LDO decreases over time as the power source discharges naturally and with use. As a result of this discharging of the power source, the difference between the input voltage and the output voltage may approach the dropout voltage of the LDO.

Additionally, other components such as a display, screen, speaker etc. of a host device that incorporates the circuitry 100 may draw current $I_1$, from the battery, which can cause the supply voltage magnitude $V_S$ supplied to the bias generator module 120 to decrease as a result of the effect of the parasitic resistance $R_{110}$. Thus the difference between the supply voltage $V_S$ and the bias voltage $V_{BIAS}$ may decrease and approach the dropout voltage.

If the headroom decreases to a level below the dropout voltage, the LDO will enter "dropout" operation, in which the LDO may not be able to regulate the output voltage at the desired nominal level.

In circuitry 100, if the bias generator module 120 were to enter "dropout" operation, then the bias voltage $V_{BIAS}$ would not be supplied to force sensor 130 at the desired level. This could lead to the sensitivity of the force sensor 130 being unpredictable and may lead to the detection of false positives or the force sensor 130 not detecting an interaction from a user.

One option to accommodate an input voltage from a decaying source to bias generator 120 may be to set $V_{BIAS}$ at an appropriately low magnitude. The difference between the input supply voltage $V_S$ and the bias voltage $V_{BIAS}$ may be configured such that enough headroom is provided that the difference between the two voltages, i.e. $V_S - V_{BIAS}$, does not fall below the dropout voltage. However, the sensitivity of the force sensor 130 is a function of $V_{BIAS}$ and therefore maintaining $V_{BIAS}$ at a low magnitude may lead to low sensitivity of the force sensor 130, which in turn leads to a poor user experience, as interactions from a user with the force sensor 130 (e.g. touches) may not be detected.

Figure 2:
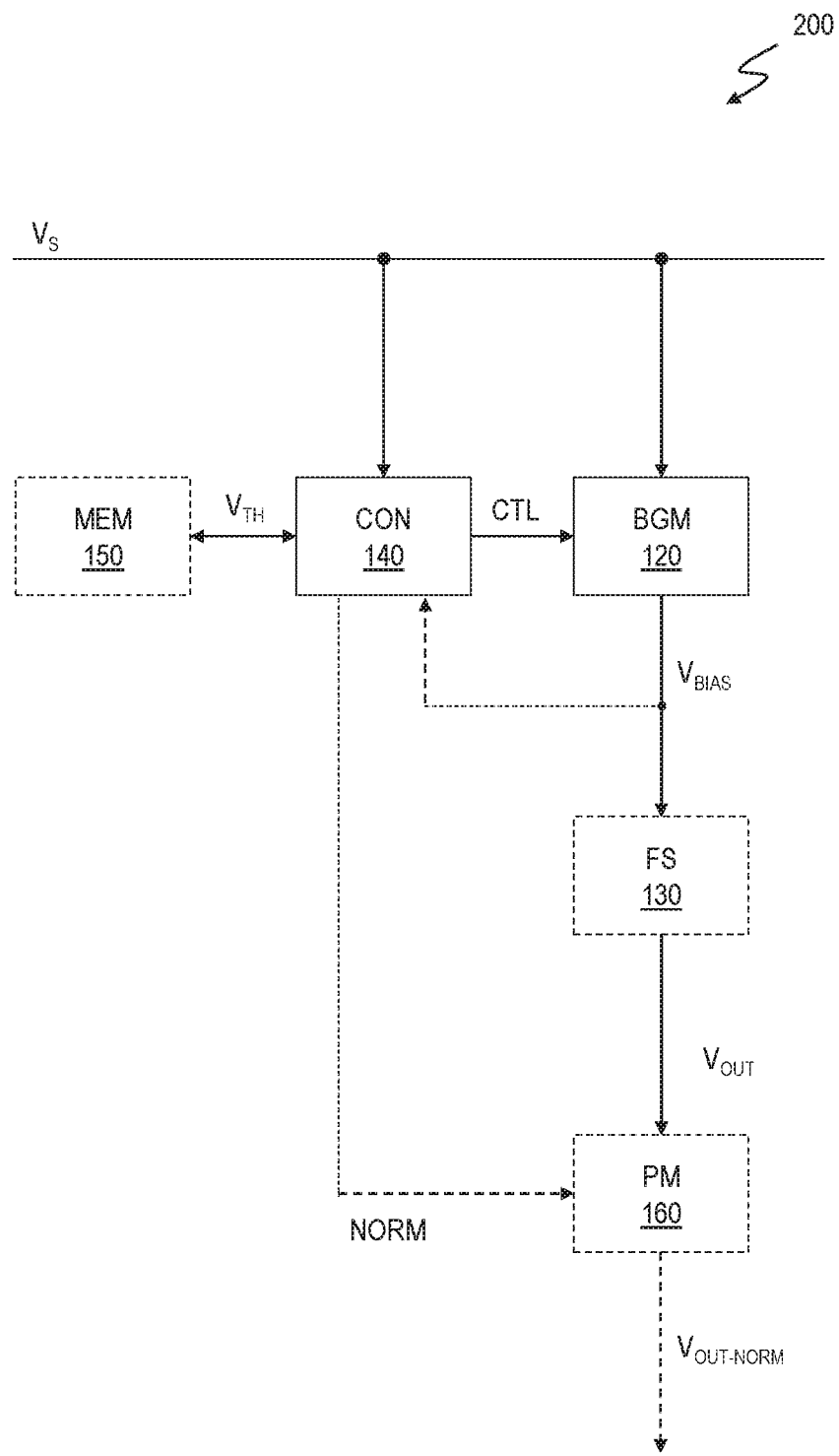
FIG. 2 illustrates another example of circuitry for biasing a force sensor.

FIG. 2 illustrates another example of circuitry 200 for biasing a force sensor 130. Circuitry 200 comprises bias generator module 120 which operates in substantially the same way as described with reference to circuitry 100, illustrated in FIG. 1, to generate bias voltage $V_{BIAS}$ for biasing force sensor 130.

Bias generator module 120 may receive supply voltage $V_S$ from a suitable power source and generate a bias voltage $V_{BIAS}$. Circuitry 200 illustrates supply voltage $V_S$ being supplied from a power supply rail. It will be appreciated that the power supply rail may be supplied from any suitable power source, such as power source 110 of circuitry 100, illustrated in FIG. 1. In one embodiment, supply voltage $V_S$ may be derived from a battery.

As discussed above, force sensor 130 may comprise any sensor capable of detecting a force applied by a user (e.g. touch or press of the sensor). In some embodiments, force sensor 130 may comprise any one of restive, inductive, capacitive, resistive-inductive-capacitive and piezo-electric force sensors. In one embodiment, force sensor 130 may comprise a resistive force sensor such as a Wheatstone bridge based resistive force sensor configured to detect a force from a user interaction and to generate $V_{OUT}$ for further processing.

In one embodiment, force sensor 130 may comprise a force sensor unit comprising a plurality of force sensors. Each of the plurality of force sensors may be configured to receive the bias voltage $V_{BIAS}$ to bias each force sensor.

As discussed in relation to circuitry 100, minimising noise in bias voltage $V_{BIAS}$ may lead to improved performance and sensitivity of force sensor 130. Therefore, bias generator 120 may be configured with a relatively high PSRR, such that noise and/or ripple on the supply voltage $V_S$ is suppressed as much as possible in the resultant bias voltage $V_{BIAS}$. Therefore, in some embodiments, bias generator 120 may comprise a linear voltage regulator, such as an LDO. However, as discussed above, the performance of the LDO may be limited by its dropout voltage. The LDO entering "dropout" can lead to a degraded bias voltage $V_{BIAS}$ and, in turn, a degraded sensitivity of force sensor 130 since the sensitivity of the force sensor is dependent upon $V_{BIAS}$.

Circuitry 200 comprises a control module (CON) 140. Control module 140 is configured to receive the supply voltage $V_S$ and to compare the supply voltage $V_S$ or a voltage indicative of the supply voltage $V_S$ to a threshold voltage $V_{TH}$, which in one embodiment may be selected from memory 150 by control module 140. It should be noted that herein a voltage indicative of the supply voltage $V_S$ is meant to also include the supply voltage $V_S$. Control module 140 is further configured to output a control signal CTL to bias generator module 120 based on the comparison. The bias generator module 120 is further configured to control the bias voltage $V_{BIAS}$ based on the control signal CTL.

As discussed above, where supply voltage $V_S$ is derived from a decaying source, such as a battery, $V_S$ will decrease and eventually the difference between $V_S$ and $V_{BIAS}$ may be less than the dropout voltage of bias generator module 120. Circuitry 200 is therefore configured with control module 140, which compares the supply voltage $V_S$, or a voltage derived therefrom, to a first suitable threshold voltage. In some embodiments, the threshold voltage is set at a predefined value above the dropout voltage of the bias generator module 120. Therefore, the supply voltage $V_S$ falling below the first threshold voltage is indicative that the magnitude of supply voltage $V_S$ has decayed to a level at which the difference between the supply voltage $V_S$ and the bias voltage $V_{BIAS}$ is approaching the dropout voltage of the bias generator module 120. Therefore, in response to the supply voltage $V_S$ falling below the first threshold voltage, control module 140 may output an appropriate control signal to control the bias generator module 120 to output a bias voltage $V_{BIAS}$ at a lower magnitude so as to increase the difference between bias voltage $V_{BIAS}$ and the supply voltage $V_S$ so as to prevent the bias generator 120 from entering "dropout" operation.

In one embodiment, the bias generator module 120 may be operable to output the bias voltage $V_{BIAS}$ at a first defined magnitude or at a second defined magnitude, different from the first defined magnitude. The bias generator module 120 may further be operable to adjust the bias voltage $V_{BIAS}$ from the first defined magnitude to the second defined magnitude based on the control signal CTL.

The second defined magnitude of the bias voltage $V_{BIAS}$ may be smaller than the first defined magnitude, and in response to determining that the supply voltage $V_S$ has fallen below its associated threshold voltage, control module 140 may output control signal CTL to the bias generator module 120 to control the bias generator module 120 to transition the bias voltage $V_{BIAS}$ from the first defined magnitude to the second defined magnitude. In response to receiving the control signal CTL, the bias generator module 120 may switch from outputting $V_{BIAS}$ at the first defined magnitude to outputting $V_{BIAS}$ at the second defined magnitude.

By outputting $V_{BIAS}$ at the second (lower) defined magnitude, the difference between the supply voltage $V_S$ and the bias voltage $V_{BIAS}$ may increase, such that the difference between the two voltages may be greater than the dropout voltage. As such, when the bias voltage $V_{BIAS}$ is at the second, lower magnitude, a further decrease in the supply voltage (e.g. as a result of further battery discharge) can be accommodated before the bias generator module 120 enters "dropout" operation.

Similarly, the bias generator module 120 may be configured to adjust the bias voltage $V_{BIAS}$ from the second defined voltage magnitude to the first defined voltage magnitude based on the control signal CTL. In one embodiment, in response to determining that the supply voltage $V_S$ has increased above a second threshold voltage (which may be the same as or different to the first threshold voltage), the control module 140 may output control signal CTL to control the bias generator module 120 to transition the bias voltage $V_{BIAS}$ from the second defined magnitude to the first defined magnitude. In response to receiving this control signal CTL the bias generator module 120 may switch from outputting $V_{BIAS}$ at the second defined magnitude to outputting $V_{BIAS}$ at the first defined magnitude.

In some embodiments, bias generator module 120 may be operable to output $V_{BIAS}$ at a plurality of different defined magnitudes, depending on the level of the supply voltage $V_S$, as will be explained in more detail below.

With reference to FIG. 2, circuitry 200 may comprise a memory (MEM) 150, which may be configured to store a plurality of threshold voltage values for use by the control module 140. In one embodiment, control module 140 may be configured to select one of the plurality of threshold voltage values to compare to the supply voltage $V_S$. The control module 140 may be also be configured to store within the memory 150 one or more threshold voltage values for comparison to the supply voltage Vs.

As will be described in more detail below, in one embodiment, the control module 140 may select the threshold voltage value based on a magnitude of the supply voltage $V_S$ at a particular point in time, e.g. a current or present magnitude of the supply voltage $V_S$. In one embodiment the plurality of threshold voltage values may be stored in a lookup table (LUT) and the control module 140 may be configured to select voltage threshold values from the lookup table based on the current magnitude of the supply voltage $V_S$.

The plurality of voltage threshold values may therefore be preprogramed and stored in memory 150. The threshold voltage values may be computed as a function of the dropout voltage $V_{DO}$ and the bias voltage magnitudes $V_{BIAS}$ generated by bias generator module 120. The threshold voltage values $V_{TH-N}$ may be computed according to:

$$V_{TH-N} = V_X + V_{DO} + V_{BIAS-N} \qquad (1)$$

Where $V_X$ is a defined voltage value, $V_{DO}$ is the dropout voltage of the bias generator module 120 and $V_{BIAS-N}$ is a bias voltage magnitude output by bias generator module 120.

$V_X$ may therefore be configured as an appropriate value above the dropout voltage $V_{DO}$. For example, $V_X$ may be about 100 mV. In response to the supply voltage $V_S$ decaying below the example $V_{TH-N}$ value, the 100 mV margin of $V_X$ ensures that the control module 140 has sufficient time to output a control signal CTL to the bias generator module 120 to reduce the bias voltage $V_{BIAS}$ from a first magnitude, for example, to a second smaller magnitude, before the supply voltage decays to the extent that bias generator module 120 enters "dropout" operation.

As the bias voltage magnitude decreases, the threshold voltage value may therefore also decrease by a corresponding magnitude by equation (1). Therefore, a plurality of voltage threshold values ($V_{TH-1}$, $V_{TH-2}$ ... $V_{TH-N}$) may be computed corresponding to the plurality of bias voltage magnitudes ($V_{BIAS-1}$, $V_{BIAS-2}$ ... $V_{BIAS-N}$) that may be generated by bias generator 120. In other embodiments, the value $V_X$ may be different for different bias voltage magnitudes. The appropriate value of $V_X$ may be determined for each bias voltage magnitude depending on a given application of circuitry 200.

Figure 3:
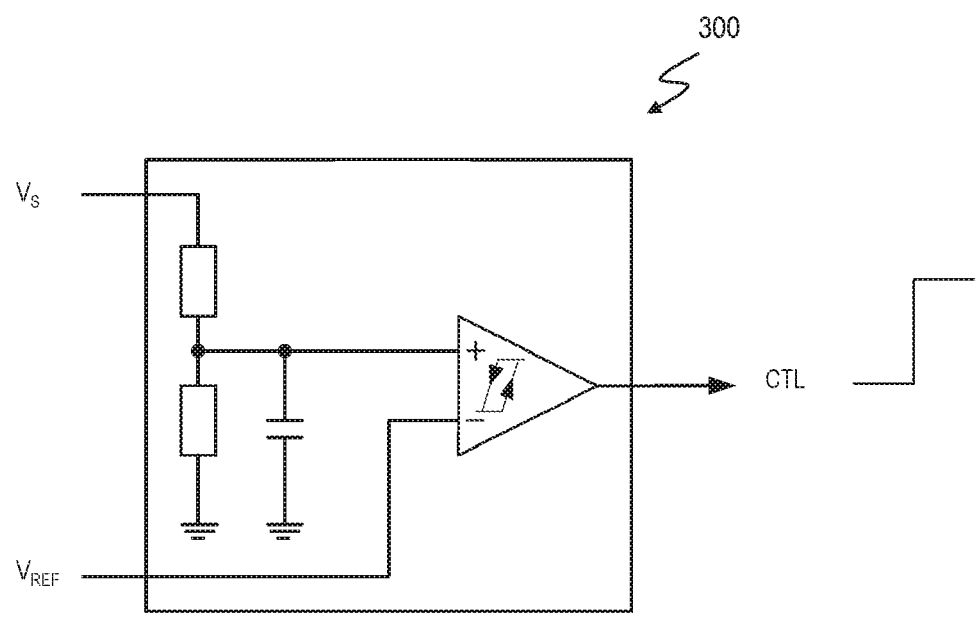
FIG. 3 illustrates an example of a hysteretic comparator for comparing a supply voltage to a reference voltage.

FIG. 3 illustrates a hysteretic comparator 300 which in some embodiments may be included in control module 140 of circuitry 200. Hysteretic comparator 300 may be configured to receive the supply voltage $V_S$, or a voltage indicative of the supply voltage $V_S$, and to compare the supply voltage $V_S$, or the voltage indicative of the supply voltage $V_S$, to a reference voltage $V_{REF}$. The reference voltage $V_{REF}$ corresponds to an appropriate one of the threshold voltage values $V_{TH-N}$. Control module 140 may therefore select a voltage threshold value from memory 150 and input this value to the hysteretic comparator 300 as the reference voltage $V_{REF}$.

Alternatively, the reference voltage $V_{REF}$ may be a fixed voltage value and a voltage indicative of the supply voltage $V_S$ may be varied. For example, memory 150 may comprise a plurality of predetermined voltage values indicative of the supply voltage $V_S$. The control module 140 may be configured to select one of the plurality of predetermined voltage values indicative of the supply voltage $V_S$ to compare to the fixed voltage reference voltage $V_{REF}$, based on the supply voltage $V_S$. As the magnitude of the supply voltage $V_S$ increases/decreases the control module 140 may select a different one of the plurality of predetermined voltage values corresponding to the magnitude of the supply voltage $V_S$.

Based on the comparison of the supply voltage $V_S$ (or voltage indicative thereof) to the reference voltage $V_{REF}$, the hysteretic comparator 300 may output control signal CTL to bias generator module 120. FIG. 3 illustrates that control signal CTL may be a two-level, i.e. binary, signal, which may take either a high value or a low value. However, control signal CTL may comprise any suitable signal to control the bias generator module 120 according to the present disclosure.

In operation of the hysteretic comparator 300, the magnitude of the supply voltage $V_S$ may fall below the reference voltage $V_{REF}$, indicating that the supply voltage $V_S$ is approaching a level at which the bias generator module 120 would enter dropout. In response, the hysteretic comparator 300 outputs control signal CTL to cause the bias generator module 120 to transition the bias voltage $V_{BIAS}$ from, for example, a first defined magnitude to a second defined magnitude. The control signal CTL may be output directly to the bias generator module 120 or alternatively the control signal CTL may be output to intermediate processing circuitry before being supplied to bias generator module 120. The second defined magnitude may comprise a smaller magnitude than the first defined magnitude. Therefore, this transition may increase the headroom between the supply voltage $V_S$ and the bias voltage $V_{BIAS}$, and prevent the bias generator module from entering "dropout" operation.

When the magnitude of the supply voltage $V_S$ rises above the reference voltage $V_{REF}$, by the amount of a hysteresis voltage $H_V$ of the hysteretic comparator 300, hysteretic comparator 300 outputs control signal CTL to the bias generator module 120 to cause the bias generator module 120 to transition the bias voltage $V_{BIAS}$ from the second bias voltage defined magnitude to the first defined bias voltage magnitude.

As the comparator 300 is a hysteretic comparator, the response to reference voltage $V_{REF}$ that is compared to the supply voltage $V_S$ when the supply voltage $V_S$ is falling occurs at a value that is different from (less than) the response to reference voltage $V_{REF}$ that is compared to the supply voltage $V_S$ when the supply voltage $V_S$ is rising.

As will be described in more detail below, hysteretic comparator 300 may thus apply a voltage hysteresis $H_V$ to prevent undesirable frequent transitions of the bias voltage $V_{BIAS}$ output by bias generator module 120. Alternatively or additionally, a time hysteresis $H_T$ may be applied by hysteretic comparator 300, in which a time delay $\Delta T$ may be applied before outputting the control signal CTL to the bias generator module 120 to change the magnitude of the bias voltage $V_{BIAS}$.

Figure 4A:
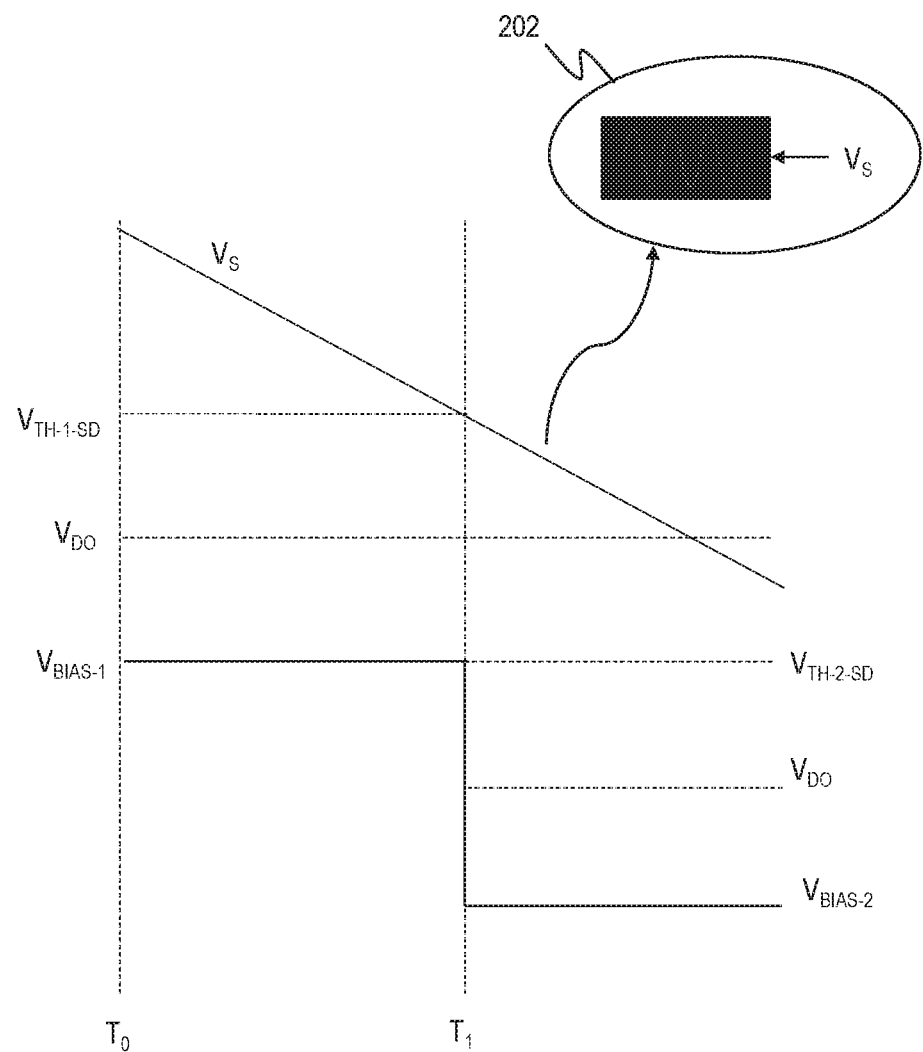
FIGS. 4a to 4c are timing diagrams illustrating the operation of the circuitry of FIG. 2.

FIG. 4a is a timing diagram showing the operation of circuitry 200 in response to a decaying supply voltage $V_S$. As illustrated in FIG. 4a the magnitude of the supply voltage $V_S$ decreases over time. As discussed above, control module 140 compares the supply voltage $V_S$, or a voltage derived therefrom, to a threshold voltage. The control module 140 may comprise hysteretic comparator 300 to perform said comparison.

As illustrated in expansion 202, the supply voltage $V_S$ may include some AC noise component in addition to the DC voltage component. As discussed with reference to FIG. 1, noise may be introduced into the DC supply voltage $V_S$ due to parasitic elements in the power source and/or arising from other electrical components and wiring when drawing current $I_1$ from the power source. In some embodiments, the power source and circuitry 200 may form part of a portable device and the AC component may arise from the "bumblebee effect" (also referred to as "TDM noise") observed in some mobile communications devices.

Referring to FIG. 4a, the control module 140 may be configured to compare the supply voltage $V_S$ to a first step-down voltage threshold value $V_{TH-1-SD}$. Control module 140 may therefore be configured to select first step-down voltage threshold value $V_{TH-1-SD}$ from memory 150.

The control module 140 may select the threshold voltage value based on the supply voltage $V_S$. The control module 140 may thus, in one embodiment, monitor the supply voltage $V_S$ and determine whether the supply voltage $V_S$ is decreasing or increasing in magnitude. In response to a determination that the supply voltage $V_S$ is decreasing in magnitude, the control module 140 determines that the bias voltage $V_{BIAS}$ may need to undergo a step-down transition, to prevent the bias generator module 120 from entering "dropout" operation. The control module 140 may therefore select a corresponding step-down threshold value for use as the reference voltage $V_{REF}$ to which the (decreasing) supply voltage $V_S$ is compared by the hysteretic comparator 300.

Similarly, in response to a determination that the supply voltage is increasing in magnitude, the control module 140 determines that the bias voltage $V_{BIAS}$ may need to undergo a step-up transition. As will be described in more detail below, increasing the bias voltage magnitude may improve the sensitivity of the force sensor 130. The control module 140 may therefore select a corresponding step-up threshold voltage value for use as the reference voltage $V_{REF}$ to which the (increasing) supply voltage $V_S$ is compared by the hysteretic comparator 300.

The control module 140 may also select the threshold voltage value based on a magnitude of the supply voltage $V_S$, e.g. a present or current magnitude of the supply voltage $V_S$. As discussed above, memory 150 may store a plurality of threshold voltage values. In one example, control module 140 may determine that bias voltage $V_{BIAS}$ may need to undergo a step-down transition after a period of time due to a decreasing supply voltage $V_S$. The control module 140 may therefore determine the present magnitude of the supply voltage $V_S$ and select the appropriate step-down threshold voltage value. The control module 140 may then compare this step-down threshold voltage value to the supply voltage $V_S$.

Similarly, control module 140 may determine that bias voltage $V_{BIAS}$ may need to undergo a step-up transition after a period of time due to an increasing supply voltage $V_S$. The control module 140 may therefore determine the present magnitude of the supply voltage $V_S$ and select the step-up threshold voltage value that is closest to the magnitude of the supply voltage $V_S$. The control module 140 may then compare this step-up threshold voltage value to the supply voltage $V_S$.

Referring to FIG. 4a, at time $T_0$ the supply voltage $V_S$ is illustrated as decaying. The control module 140 may therefore select first step-down threshold voltage value $V_{TH-1-SD}$ to compare to the supply voltage $V_S$, based on the decaying supply voltage $V_S$ and on the magnitude of the supply voltage at $T_0$.

At time $T_1$, the result of the comparison of the supply voltage $V_S$ to the first step-down threshold voltage $V_{TH-1-SD}$ by control module 140 may be indicative that the supply voltage $V_S$ has reached or has fallen below the first step-down threshold voltage $V_{TH-1-SD}$. This may therefore be indicative that the difference between the supply voltage $V_S$ and the bias voltage $V_{BIAS}$ is approaching the dropout voltage $V_{DO}$ of the bias generator module 120. The control module 140 may therefore output a control signal CTL to bias generator module 120 to control the bias generator module 120 to transition from outputting $V_{BIAS}$ at a first defined magnitude $V_{BIAS-1}$, to outputting $V_{BIAS}$ at a second defined magnitude $V_{BIAS-2}$. Second defined magnitude $V_{BIAS-2}$ is smaller than the first defined magnitude $V_{BIAS-1}$ and therefore the bias voltage $V_{BIAS}$ may undergo a step-down transition.

The control module 140 may be configured to apply a time delay $\Delta T$ before outputting the control signal CTL. Thus in some embodiments when the supply voltage $V_S$ decays below first step-down threshold value $V_{TH-1-SD}$ at time $T_1$, the control module 140 may not output control signal CTL immediately upon the supply voltage $V_S$ falling below first step-down threshold value $V_{TH-1-SD}$, but may instead output the control signal CTL upon the expiry of the time delay $\Delta T$. This time hysteresis can help to prevent frequent transitions from $V_{BIAS-1}$ to $V_{BIAS-2}$ resulting from transient variations in $V_S$ that may arise due to noise, for example.

The difference between the supply voltage $V_S$ and the bias voltage $V_{BIAS}$ at the second defined magnitude $V_{BIAS-2}$ may therefore be greater than the dropout voltage $V_{DO}$ of the bias generator module 120. Thus, as illustrated, if the supply voltage $V_S$ continues to decay after time $T_1$, the bias generator module 120 does not enter "dropout" operation.

As illustrated in FIG. 4a, the bias generator module 120 switching the bias voltage $V_{BIAS}$ to the second, smaller magnitude $V_{BIAS-2}$ effectively "shifts" the voltage at which dropout occurs, to a smaller magnitude, corresponding to the difference in magnitude between $V_{BIAS-1}$ and $V_{BIAS-2}$. As the dropout voltage $V_{DO}$ is reduced, in future comparisons of the supply voltage $V_S$ to the threshold voltage $V_{TH}$, a lower threshold value must be selected to reflect the reduction in $V_{DO}$.

Therefore, at time $T_1$, the control module 140 may select second step-down threshold voltage $V_{TH-2-SD}$ to compare to the supply voltage $V_S$ in future. In response to the magnitude of the supply voltage $V_S$ falling below the first step-down threshold voltage $V_{TH-1-SD}$, the next smallest step-down threshold voltage i.e. second step-down threshold voltage $V_{TH-2-SD}$ may therefore be selected by control module 140.

FIG. 4a illustrates the bias generator transitioning from a first bias voltage magnitude $V_{BIAS-1}$ to a second, smaller bias voltage magnitude $V_{BIAS-2}$. However, as discussed above, bias generator module 120 may be configured to output a plurality of different bias voltage magnitudes. It will be appreciated that the transitioning method described with reference to FIGS. 2a and 2b may be applicable to any decreasing transition of bias generator module 120, to transition from a first defined bias voltage magnitude to a second defined bias voltage magnitude, smaller than the first defined bias voltage magnitude. For example, bias generator module 120 may transition the output bias voltage $V_{BIAS}$ from second bias voltage magnitude $V_{BIAS-2}$ to a third bias voltage magnitude $V_{BIAS-3}$, where $V_{BIAS-3}$ is smaller in magnitude than $V_{BIAS-2}$.

The discussion above with respect to FIG. 4a is therefore applicable for a bias generator 120 configured to output N bias voltage magnitudes and configured to transition from a first voltage magnitude $V_{BIAS-N-1}$ to a further, smaller, magnitude $V_{BIAS-N}$. In some embodiments, the difference in magnitude between the N bias voltages may be equal. In some embodiments, the difference in magnitude between the N bias voltages may be unequal.

In embodiments, where the bias generator 120 is configured to output N bias voltage magnitudes, control module 140 may therefore be configured to compare the supply voltage $V_S$ to N voltage threshold magnitudes. Each of the N bias voltages may therefore be associated with a corresponding one of the N voltage thresholds, such that when the bias generator module 120 is outputting the bias voltage at $V_{BIAS-N}$, the control module is configured to compare the supply voltage $V_S$ to the threshold voltage $V_{TH-N}$ corresponding to $V_{BIAS-N}$.

It will be appreciated that when the supply voltage $V_S$ is derived from a decaying source, there may be a finite amount of energy stored in said source. Therefore, after a certain decay time, there may be substantially no energy left in the source and $V_S$=0V. It will also be appreciated that bias generator 120 could therefore not indefinitely transition to lower bias voltage magnitudes and there would be a finite number of N bias voltage magnitudes which the bias generator could output.

Figure 4B:
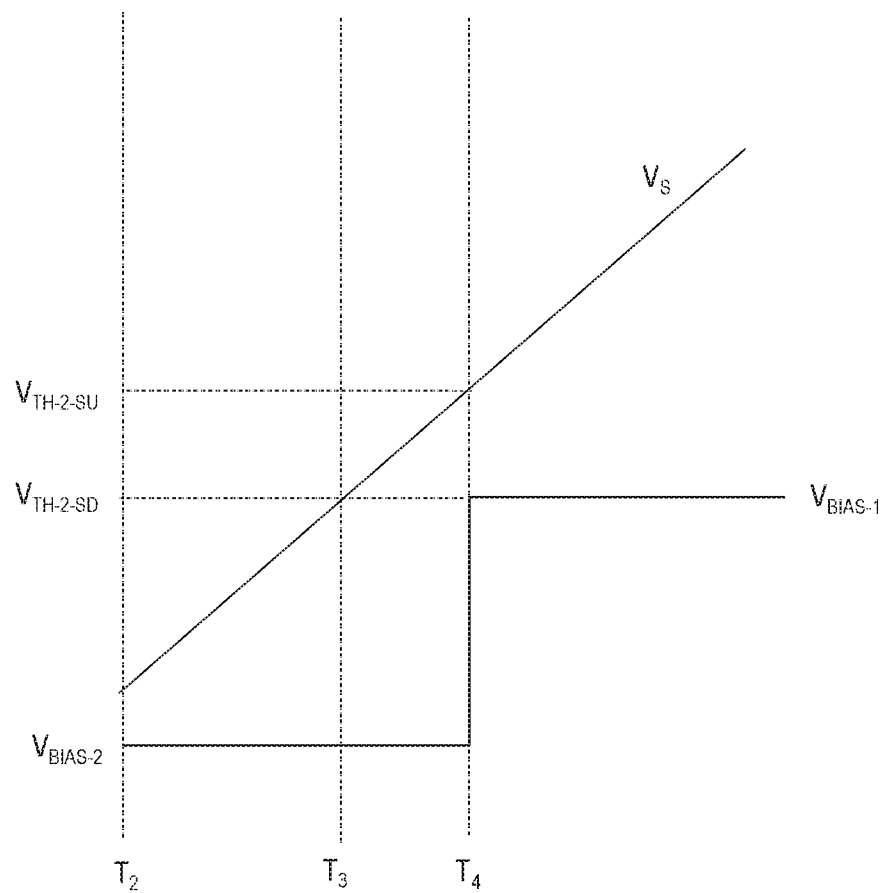

FIG. 4b is a timing diagram showing the operation of circuitry 200 in response to an increasing supply voltage $V_S$. Supply voltage $V_S$ may be derived from a generally decaying source such as a battery. However, the power source from which the supply voltage $V_S$ is derived may be connected to a charging source. The supply voltage $V_S$ magnitude may therefore increase.

At time $T_2$ the bias generator module 120 may be outputting the bias voltage at second defined bias voltage magnitude $V_{BIAS-2}$. Based on the supply voltage $V_S$ magnitude and the increasing supply voltage $V_S$ magnitude at time $T_2$, the control module may select second step-up threshold voltage $V_{TH-2-SU}$ to compare to supply voltage $V_S$.

As illustrated, second step-up threshold voltage value $V_{TH-2-SU}$ may be larger in magnitude than second step-down threshold voltage value $V_{TH-2-SD}$. The difference in threshold voltage magnitudes for a step-up transition and a step-down transition between two defined bias voltages $V_{BIAS}$ helps to mitigate against frequent switching of the bias generator module 120.

As discussed above in relation to FIG. 2a, there may be an AC noise component carried by the supply voltage $V_S$. If the threshold voltage value were the same, the control module 140 may determine that the supply voltage has decayed below the voltage threshold $V_{TH-1}$. In response to this comparison, the bias generator module may transition the bias voltage from $V_{BIAS-1}$ to $V_{BIAS-2}$. However, due to the random nature of the AC noise component, this component may cause the magnitude of the supply voltage $V_S$ to repeatedly rise above the threshold voltage $V_{TH-1}$ and then fall back below the threshold voltage $V_{TH-1}$ after a short period of time. This behaviour may cause the control module 140 to control the bias generator module 120 to undergo frequent transitions between $V_{BIAS-1}$ and $V_{BIAS-2}$. This behaviour is undesirable as it puts increased strain on the bias generator module 120. The frequent transitions may also introduce some noise into the bias voltage $V_{BIAS}$, which may degrade the performance of the force sensor 130.

In another example, the power source supplying $V_S$ may be disconnected from a charging source, shortly after the supply voltage $V_S$ increases above the threshold voltage e.g. $V_{TH-1}$. In such an example, when the supply voltage $V_S$ increases above the threshold $V_{TH-1}$, the control module 140 may output a control signal CTL to control the bias generator module 120 to transition the bias voltage from $V_{BIAS-2}$ to $V_{BIAS-1}$.

However, if the power source is disconnected from the charging source at or shortly after the supply voltage $V_S$ increases above the threshold $V_{TH-1}$, then the supply voltage $V_S$ may immediately begin to decay and as such may drop below the threshold $V_{TH-1}$, shortly after increasing above threshold $V_{TH-1}$. In this case, the control module 140 may output control signal CTL for the bias generator module 120 to transition from $V_{BIAS-1}$ to $V_{BIAS-2}$, shortly after undergoing the opposite transition. This frequent transitioning may again be undesirable.

Furthermore, if a charging source is disconnected at or substantially at the threshold voltage, the control module 140 may not have enough time to output the control signal CTL in response to the decaying supply voltage $V_S$. As such, the difference between $V_S$ and $V_{BIAS}$ may decrease to a point where the voltage generator module 120 enters "dropout" operation before the control module 140 has time to output an appropriate control signal CTL.

Therefore, in some embodiments, voltage hysteresis $H_V$ is applied to prevent such frequent transitioning behaviour. Memory 150 may store a larger threshold voltage for an increasing transition between two bias voltages than for the corresponding decreasing transition. Control module 140 may therefore compare the supply voltage $V_S$ to a second step-down voltage threshold $V_{TH-2-SD}$ for a decreasing transition between $V_{BIAS-1}$ and $V_{BIAS-2}$, and compare supply voltage $V_S$ to second step-up voltage threshold $V_{TH-2-SU}$, which is higher than the second step-down voltage threshold $V_{TH-2-SD}$, for an increasing transition between $V_{BIAS-1}$ and $V_{BIAS-2}$.

Although separate step-down and step-up threshold voltage values have been described above, in another embodiment, separate step-up and step-down voltage threshold values may not be provided. Instead, the hysteretic comparator may be designed so as to provide a greater voltage threshold value for a step-up transition than for a corresponding step-down transition.

Referring again to FIG. 4*b*, at time $T_3$, supply voltage $V_S$ may increase above second step-down threshold voltage value $V_{TH-2-SD}$. However, as discussed above, this will not cause the bias voltage $V_{BIAS}$ to undergo an increasing transition, to avoid frequent bias voltage $V_{BIAS}$ transitions.

At time $T_4$, supply voltage $V_S$ may increase above second step-up voltage threshold value $V_{TH-2-SU}$. In response to this comparison, control module 140 may output control signal CTL to bias generator module 120 to transition the bias voltage from second defined bias voltage magnitude $V_{BIAS-2}$ to first bias voltage magnitude $V_{BIAS-1}$, as illustrated.

First defined bias voltage magnitude $V_{BIAS-1}$ may be the largest magnitude bias voltage $V_{BIAS}$ that may be output by bias generator module 120. Therefore, there may be no step-up transition beyond $V_{BIAS-1}$ that the bias generator module can transition to. Therefore, with the bias voltage $V_{BIAS}$ being output at the maximum possible magnitude and with the magnitude of the supply voltage increasing, the control module 140 may not compare the supply voltage to any threshold voltage $V_{TH}$.

Figure 4C:
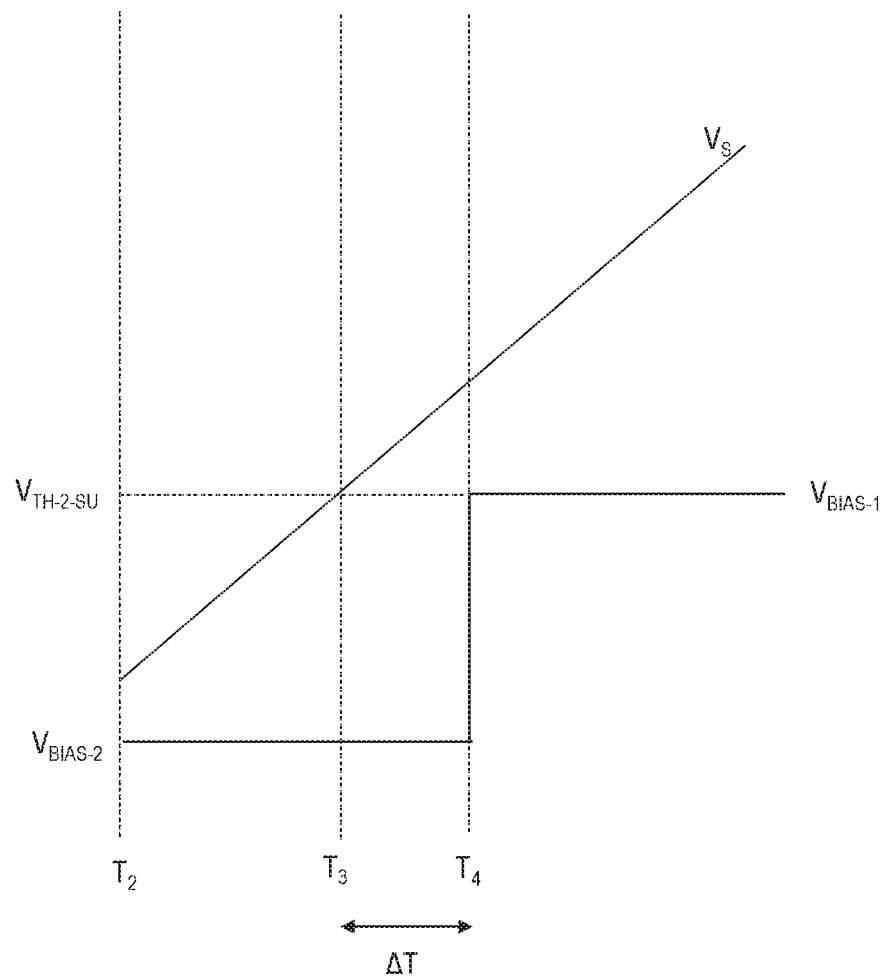

FIG. 4*c* is another timing diagram showing the operation of circuitry 200 in response to an increasing supply voltage $V_S$. At time $T_2$, bias generator module 120 may be outputting bias voltage $V_{BIAS}$ at second defined bias voltage magnitude $V_{BIAS-2}$. As described in relation to FIG. 4*b*, due to the magnitude and increasing magnitude of supply voltage $V_S$ at time $T_0$, the control module 140 may therefore select second step-up threshold voltage value $V_{TH-2-SU}$ to compare to supply voltage $V_S$.

At time $T_3$ supply voltage $V_S$ may increase above the second step-up threshold voltage value $V_{TH-2-SU}$. However, as illustrated, bias voltage $V_{BIAS}$ does not immediately undergo an increasing magnitude transition in response to the result of this comparison at time $T_3$. Rather in FIG. 4*c*, the bias voltage $V_{BIAS}$ may transition from second defined bias voltage magnitude $V_{BIAS-2}$ to first defined bias voltage magnitude $V_{BIAS-1}$ upon the expiry of time delay $\Delta T$ at time $T_4$.

Thus, control module 140 may be configured to apply a time delay $\Delta T$ in response to determining that the supply voltage $V_S$ has increased above the threshold voltage. Upon expiry of the time delay $\Delta T$, the control module 140 may output control signal CTL to bias generator module 120 to control the bias generator module 120 to transition from outputting the bias voltage $V_{BIAS}$ at second defined bias voltage magnitude $V_{BIAS-2}$ to first defined bias voltage magnitude $V_{BIAS-1}$, larger than the second defined bias voltage magnitude $V_{BIAS-2}$.

The control module 140 applying a time delay $\Delta T$ before outputting the control signal CTL helps to prevent the bias generator module 120 from undergoing frequent transitions. The time delay $\Delta T$ may be selected so as to allow sufficient time for transient effects such as voltage spikes due to noise to settle or subside before causing the bias voltage $V_{BIAS}$ to change.

As described, the supply voltage $V_S$ may include an AC noise component, which may cause supply voltage $V_S$ to increase above the threshold voltage e.g. $V_{TH-2-SU}$. However, the AC component may cause the supply voltage $V_S$ to drop below the threshold voltage, shortly after the control module 140 has determined that the supply voltage $V_S$ has increased above the threshold voltage. Without the application of the time delay $\Delta T$, the bias voltage may transition every time the supply voltage $V_S$ passes above and below the threshold voltage. When the supply voltage $V_S$ includes an AC noise component, this can lead to frequent transitions of the bias voltage $V_{BIAS}$ due to transient noise effects, which as discussed above is undesirable.

The application of the time delay $\Delta T$ therefore allows sufficient time for transient effects to elapse before the bias voltage undergoes a step-up transition.

The time delay $\Delta T$ may be selected appropriately for a given system. The time delay may be predetermined and stored in memory 150. The time delay $\Delta T$ may be predetermined based on, for example, an expected rate of increase of the supply voltage $V_S$ for a given system.

In one embodiment, the control module 140 may monitor the supply voltage during the time delay $\Delta T$. During the time delay $\Delta T$, the control module 140 may determine that the general trend of the supply voltage $V_S$ has started to decay and is no longer increasing in magnitude. For example, the power supply from which the supply voltage is derived may be disconnected from a charging source and therefore the supply voltage will start to decay. The control module 140 may therefore suspend or halt the time delay $\Delta T$, without outputting control signal CTL. If the supply voltage $V_S$ then decays below the threshold voltage, e.g. $V_{TH-2-SU}$, the control module 140 may determine that the bias voltage $V_{BIAS}$ should be maintained at the lower voltage magnitude e.g. $V_{BIAS-2}$ and therefore may not output the control signal CTL. This operation again mitigates against the bias generator 120 undergoing frequent switching transitions.

During the time delay $\Delta T$, the status of the supply voltage $V_S$ may switch to indicate that the magnitude of the supply voltage $V_S$ is decreasing, as described above. However, the status of the supply voltage $V_S$ may switch again during the time delay $\Delta T$ to indicate that the magnitude of the supply voltage $V_S$ is increasing, before the supply voltage $V_S$ falls below the threshold voltage e.g. $V_{TH-2-SU}$. For example, the power source from which the supply voltage $V_S$ is derived may be momentarily disconnected from a charging source before being subsequently reconnected after a relatively short period of time.

The control module 140 may therefore reapply the time delay $\Delta T$ in response to the second change in status of the supply voltage $V_S$. The control module 140 may further output a control signal CTL, in response to the expiry of the reapplied time delay $\Delta T$. The reapplication of the time delay $\Delta T$ may again allow sufficient time for transient effects to subside or settle before a control signal CTL is output to control the bias voltage $V_{BIAS}$ to undergo an increasing transition.

In one embodiment, memory 150 may store a second time delay $\Delta T_2$ (not illustrated) to apply in response to the switch in the direction (increasing/decreasing) of change of the supply voltage $V_S$. In one embodiment, the second time delay $\Delta T_2$ may be shorter than the time delay $\Delta T$.

The skilled person will appreciate that the disclosure in relation to FIGS. 4b and 4c could be combined. A step-up transition between two defined bias voltage magnitudes could be based on a step-up threshold voltage value that is larger in magnitude than a step-down threshold voltage value for the same two bias voltage magnitudes. The control module 140 could also be configured to output the control signal CTL in response to the supply voltage magnitude remaining greater than the larger step-up threshold voltage value upon the expiry of a time delay.

Figure 5:
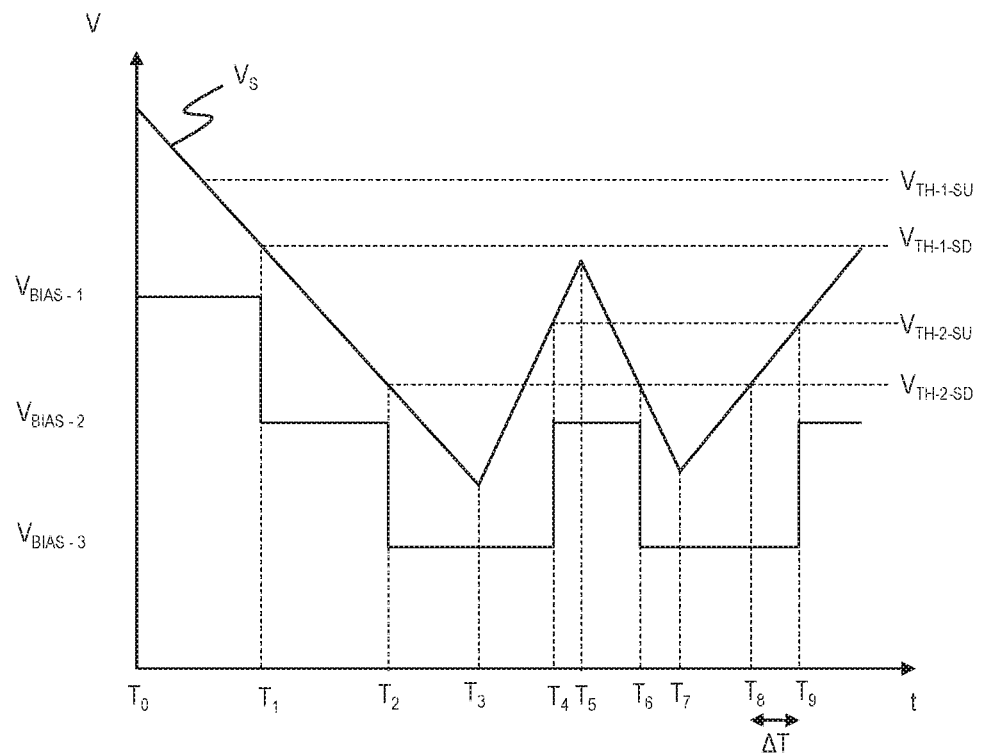
FIG. 5 is another timing diagram illustrating the operation of the circuitry of FIG. 2.

FIG. 5 is a graph illustrating the operation of bias generator module 120 and control module 140 in response to a varying supply voltage $V_S$. FIG. 5 illustrates the variation of supply voltage $V_S$ over time. $V_S$ may be derived from a source such as a battery and may be used to supply a voltage $V_S$ to bias generator module 120, as described with respect to FIGS. 4a-4c. Supply voltage $V_S$ may also be used to supply power to other components of the host electronic device. Therefore, in some embodiments, due to the current drawn from the power source to supply power to bias generator module 120 and other components, at $T_0$, supply voltage $V_S$ may begin to decay over time.

Bias generator 120 may be configured to output a plurality of different bias voltage magnitudes. In the illustrated embodiment of FIG. 5, bias generator module 120 may be configured to output three defined bias voltage magnitudes, $V_{BIAS-1}$, $V_{BIAS-2}$ and $V_{BIAS-3}$. As illustrated, the magnitudes of the bias voltages decrease from $V_{BIAS-1}$ to $V_{BIAS-3}$. However, the skilled person will appreciate that the disclosure with respect to FIG. 5 may be applied for a bias generator module 120 outputting any number of defined bias voltage magnitudes.

At $T_0$, bias generator 120 may be configured to output the bias voltage with a first magnitude of $V_{BIAS-1}$. $V_{BIAS-1}$ may correspond to the largest bias voltage magnitude output by bias generator module 120.

Between $T_0$ and $T_1$, control module 140 may compare the supply voltage $V_S$ to a step-down threshold voltage, to prevent the bias generator module from entering "dropout" operation. Therefore, during time period $T_0$-$T_1$, with the bias voltage $V_{BIAS}$ configured at a first magnitude $V_{BIAS-1}$, control module 140 may compare supply voltage $V_S$ to a first step-down threshold voltage $V_{TH-1-SD}$.

At $T_1$, control module 140 may determine that the magnitude of supply voltage $V_S$ has fallen below the first step-down threshold voltage $V_{TH-1-SD}$. As discussed with reference to FIG. 4a, control module 140 may therefore output a control signal CTL to control bias generator module 120, to transition the bias voltage $V_{BIAS}$ from first magnitude $V_{BIAS-1}$ to second, smaller magnitude $V_{BIAS-2}$. The supply voltage $V_S$ may therefore continue to decay without the bias generator module 120 entering "dropout" operation, as described above.

At $T_1$, with the supply voltage $V_S$ at a magnitude below the first step-down threshold voltage value $V_{TH-1-SD}$ and continuing to decay, control module 140 may select a second step-down voltage threshold $V_{TH-2-SD}$ as the voltage threshold $V_{TH}$.

As shown in FIG. 5, during the period $T_1$ to $T_2$, the supply voltage $V_S$ continues to decay. At time $T_2$, the control module 140 determines that the supply voltage $V_S$ has reached second step-down voltage threshold $V_{TH-2-SD}$. At time $T_2$, the control module 140 may therefore again output control signal CTL to bias generator module 120, to control the bias generator module 120 to transition the bias voltage $V_{BIAS}$ from the second bias voltage magnitude $V_{BIAS-2}$ to a third bias voltage magnitude $V_{BIAS-3}$. As illustrated, third bias voltage magnitude $V_{BIAS-3}$ has a smaller magnitude than the second bias voltage magnitude $V_{BIAS-2}$. This operation by bias generator module 120 may be carried out in the manner described above for the bias generator module 120 transition from $V_{BIAS-1}$ to $V_{BIAS-2}$.

As shown, between time periods $T_2$ and $T_3$, with the bias voltage $V_{BIAS}$ output at $V_{BIAS-3}$, the supply voltage $V_S$ continues to decay, without the bias generator entering "dropout" operation. During this period, the control module 140 may also be configured to compare the supply voltage $V_S$ to a third step-down voltage threshold $V_{TH-3-SD}$ (not illustrated). Third step-down voltage threshold $V_{TH-3-SD}$ may be set at a smaller magnitude than second step-down voltage threshold $V_{TH-2-SD}$. If the supply voltage $V_S$ were to fall below the third step-down voltage threshold $V_{TH-3-SD}$ the control module would output a control signal CTL to the bias generator module 120 to transition the bias voltage from third bias voltage magnitude $V_{BIAS-3}$ to a fourth bias voltage magnitude $V_{BIAS-4}$ (not illustrated). $V_{BIAS-4}$ may have a smaller magnitude than third bias voltage magnitude $V_{BIAS-3}$.

At time $T_3$, the supply voltage $V_S$ stops decaying and begins to increase in magnitude. This change may correspond, for example, to a battery being connected to an external power source and being charged up. In another example, there may be a reduction in current drawn from the battery of a host device due to other components of the host device (e.g. a display or screen of the host device) being powered off, such that the effect of the parasitic resistance $R_{110}$ is reduced.

As described above, control module 140 may be configured to select the threshold voltage value $V_{TH}$ based on the changing supply voltage magnitude $V_S$. At time $T_3$, the control module may determine that the supply voltage has changed from decreasing to increasing in magnitude. At time $T_3$ the control module 140 may therefore select second step-up threshold voltage value $V_{TH\text{-}2\text{-}SU}$. Once the supply voltage has increased above second step-up threshold voltage value $V_{TH\text{-}2\text{-}SU}$, the bias voltage undergoes a transition from $V_{BIAS\text{-}3}$ to $V_{BIAS\text{-}2}$, at time $T_4$.

At time $T_5$, control module 140 may also select first step-up voltage threshold $V_{TH\text{-}1\text{-}SU}$ to compare to the supply voltage $V_S$ in future, based on the supply voltage $V_S$ increasing above second step-up voltage threshold $V_{TH\text{-}2\text{-}SU}$ and the supply voltage $V_S$ continuing to increase in magnitude.

Referring again to FIG. 5, between time periods $T_3$ and $T_6$ the magnitude of supply voltage $V_S$ is increasing. At time $T_5$, the magnitude of the supply voltage $V_S$ may stop increasing and begin to decay. For example, a battery supplying the supply voltage $V_S$ may be disconnected from a charging source at $T_5$. Therefore, at time $T_5$ the control module 140 may adjust the voltage threshold $V_{TH}$ based on the supply voltage decreasing.

Based on the decreasing supply voltage $V_S$ and the magnitude of the supply voltage $V_S$ at time $T_5$, the control module 140 may select second step-down threshold $V_{TH\text{-}2\text{-}SD}$ to compare to the supply voltage $V_S$.

Between times $T_5$ and $T_6$, supply voltage $V_S$ decays and the control module 140 compares the supply voltage $V_S$ to second step-down threshold $V_{TH\text{-}2\text{-}SD}$. At time $T_6$ the control module 140 may determine that the supply voltage $V_S$ has reached the second step-down threshold $V_{TH\text{-}2\text{-}SD}$. As such, the control module 140 outputs a control signal CTL to cause the bias generator module 120 to transition the bias voltage from $V_{BIAS\text{-}2}$ to $V_{BIAS\text{-}3}$. This operation may substantially correspond with that described at time 12 discussed above.

Between times $T_6$ and $T_7$, the control module 140 compares the supply voltage $V_S$ to third step-down voltage threshold $V_{TH\text{-}3\text{-}SD}$ (not illustrated), which may be of a smaller magnitude than second step-down voltage threshold $V_{TH\text{-}2\text{-}SD}$, as similarly described above between times $T_2$ to $T_3$.

At time $T_7$, the magnitude of the supply voltage $V_S$ stops decaying and instead begins to increase. The control module 140 therefore adjusts the voltage threshold based on the increasing magnitude of the supply voltage $V_S$.

As described with reference to FIG. 4c, control module 140 may be configured to apply a time delay $\Delta T$ before outputting control signal CTL to transition the bias voltage $V_{BIAS}$ to undergo an increasing transition (i.e. apply a time hysteresis $H_T$ to the transition). In such an embodiment, control module 140 may select the same threshold voltage value for an increasing and decreasing transition between two bias voltage thresholds or may alternatively continue to apply voltage hysteresis $H_V$ by selecting different threshold voltage values for increasing and decreasing supply voltage $V_S$ magnitude.

For example, control module 140 may be configured to compare the supply voltage $V_S$ to second step-down voltage threshold value $V_{TH\text{-}2\text{-}SD}$ to transition the bias voltage from $V_{BIAS\text{-}2}$ to $V_{BIAS\text{-}3}$ and vice versa. However, for an increasing magnitude transition e.g. from $V_{BIAS\text{-}3}$ to $V_{BIAS\text{-}2}$, the control module 140 may be configured to apply the time delay $\Delta T$ between determining when the supply voltage $V_S$ has risen above the threshold voltage and outputting the control signal CTL. As described above, this operation mitigates against frequent switching of bias generator module 120. Storing only one threshold value for a decreasing and increasing bias voltage transition may reduce the amount of memory required to store the threshold voltage values in memory 150.

Thus in the description that follows the second step-down threshold voltage value $V_{TH\text{-}2\text{-}SD}$ is used by the control module 140 as a single threshold voltage for both increasing and decreasing transitions of the bias voltage $V_{BIAS}$.

Therefore, at time $T_7$ the control module may select the second step-down voltage threshold value $V_{TH\text{-}2\text{-}SD}$ to compare to the supply voltage $V_S$. At time $T_8$ the control module 140 may determine that the supply voltage $V_S$ has reached or risen above the second step-down voltage threshold $V_{TH\text{-}2\text{-}SD}$. However, as illustrated, at time $T_8$ the bias voltage $V_{BIAS}$ is held at third bias voltage magnitude $V_{BIAS\text{-}3}$. The control module 140 may apply a time delay $\Delta T$ before outputting the control signal CTL to the bias generator module 120, as discussed above.

At time $T_9$, the time delay $\Delta T$ expires and as such the control module 140 may output the control signal CTL, to bias generator module 120 to transition the bias voltage $V_{BIAS}$ from the third bias voltage value $V_{BIAS\text{-}3}$ to the second bias voltage value $V_{BIAS\text{-}2}$.

In the illustrated embodiment of FIG. 5, the time delay $\Delta T$ may be configured such that the supply voltage $V_S$ has magnitude substantially equal to the second step-up threshold voltage $V_{TH\text{-}2\text{-}SU}$ at time $T_9$, when the time delay $\Delta T$ expires. However, in other embodiments, the time delay $\Delta T$ may be configured such that the supply voltage $V_S$ may comprise any appropriate magnitude above the threshold voltage before the bias voltage $V_{BIAS}$ undergoes an increasing transition.

FIG. 5 therefore illustrates the operation of control module 140 and bias generator module 120 in response to variations in supply voltage $V_S$. As described, the control module 140 may control operation of the bias generator module 120 to output bias voltage magnitudes $V_{BIAS\text{-}1}$, $V_{BIAS\text{-}2}$ and $V_{BIAS\text{-}3}$, in response to the variation of the supply voltage $V_S$. As discussed above, the sensitivity of force sensor 130 may be affected by the bias voltage magnitude.

Bias generator module 120 outputting the bias voltage at the first defined bias voltage magnitude $V_{BIAS\text{-}1}$, corresponds to the maximum configurable magnitude of bias generator module 120. At the first bias voltage magnitude $V_{BIAS\text{-}1}$, the sensitivity of force sensor 130 may therefore be at maximum operating conditions.

As described above, the sensitivity of the force sensor is related to (e.g. proportional to) the bias voltage $V_{BIAS}$. Therefore, with the bias voltage set at the maximum available magnitude, the sensitivity of the force sensor 130 may not be degraded and the output signal $V_{OUT}$ from force sensor 130 may be provided to downstream processing circuitry/modules.

Referring again to FIG. 2, output signal $V_{OUT}$ may therefore be provided to processing circuitry/module (PM) 160, in some embodiments.

As discussed above, supply voltage $V_S$ may decay due to current draw from the power source. Supply voltage $V_S$ may decay to first step-down voltage threshold $V_{TH\text{-}1\text{-}SD}$. When the control module 140 detects that the supply voltage $V_S$ has dropped to the first step-down voltage threshold $V_{TH-1-SD}$, the control module 140 outputs a control signal CTL to bias generator module 120 to transition bias voltage $V_{BIAS}$ from first bias voltage magnitude $V_{BIAS-1}$ to second bias voltage magnitude $V_{BIAS-2}$.

As the second bias voltage magnitude $V_{BIAS-2}$ is of a lower magnitude than the first bias voltage $V_{BIAS-1}$, the decreased bias voltage magnitude may have an effect on the sensitivity of the force sensor 130. For example, the reduced bias voltage $V_{BIAS}$ may mean that a user would have to apply an increased magnitude of force for the force sensor 130 to detect a user interaction. This can lead to a degraded user experience without further processing steps to mitigate such effects.

Therefore, in one embodiment, control module 140 may be configured to receive the bias voltage $V_{BIAS}$ and/or a voltage indicative of the bias voltage $V_{BIAS}$. Control module 140 may be further configured to apply a normalisation function NORM to the output signal $V_{OUT}$ of force sensor 130 to normalise the output signal $V_{OUT}$. The normalisation function NORM may be based on the magnitude of the bias voltage $V_{BIAS}$.

The normalisation function NORM may be configured to normalise the output signal when $V_{BIAS}$ is being output at a magnitude below $V_{BIAS-1}$ e.g. $V_{BIAS-2}$. The normalisation function may thus normalise the output signal $V_{OUT}$ such that the characteristics of $V_{OUT}$ with the bias voltage $V_{BIAS}$ at a lower magnitude substantially correspond to the output signal $V_{OUT}$ characteristics with $V_{BIAS}$ set at the maximum magnitude i.e. $V_{BIAS-1}$. As such, the application of the normalisation function may counteract the reduced sensitivity of the force sensor 130 due to the decreased magnitude of the bias voltage $V_{BIAS}$.

Referring again to FIG. 2, the normalisation function NORM may be applied to the output signal $V_{OUT}$ by processing circuitry/module 160. The processing circuitry/module 160 may receive the normalisation function NORM from control module 140 and output signal $V_{OUT}$ from force sensor 130. Processing circuitry/module 160 may then apply the normalisation function NORM to the output signal $V_{OUT}$ to output normalised output signal $V_{OUT-NORM}$. Normalised output signal $V_{OUT-NORM}$ may be output from processing circuitry/module 160 to further processing circuitry/modules (not illustrated), which may enable some functionality based on the detected user interaction from normalised output signal $V_{OUT-NORM}$.

In some embodiments, memory 150 may comprise a plurality of normalisation functions corresponding to the plurality of defined bias voltage magnitudes. The control module 140 may therefore be configured to receive the bias voltage $V_{BIAS}$ and/or a voltage indicative of the bias voltage $V_{BIAS}$ and select a corresponding one of the plurality of normalisation functions based on the bias voltage magnitude. Control module 140 may be configured to supply the corresponding normalisation function NORM to processing circuitry/module 160 which may be configured to apply the normalisation function NORM to the output signal $V_{OUT}$.

As discussed, with the bias voltage configured at the maximum configurable defined magnitude of bias generator module 120, there may be no reduced sensitivity for the force sensor 130. Therefore, in one embodiment, the normalisation function corresponding to the maximum bias voltage magnitude may correspond to substantially no normalisation.

The plurality of normalisation functions may therefore be preprogramed for a given application of the circuitry 200.

The normalisation functions may be computed in software to compensate for the reduced sensitivity of the force sensor 130 due to the reduced magnitude of the bias voltage $V_{BIAS}$.

In some embodiments, there may be a limit to how low the bias voltage $V_{BIAS}$ magnitude may drop, if the normalisation function NORM is able to appropriately normalise the corresponding output signal $V_{OUT}$ for the decreased bias voltage magnitude $V_{BIAS}$. As $V_{BIAS}$ decrease the magnitude of the output $V_{OUT}$ of the forces sensor 130 also decreases, and thus the signal to noise ratio (SNR) of $V_{OUT}$ will also decrease. The SNR may decrease to such a level that normalisation cannot compensate for the reduced SNR. This can lead to undesirable effects, such as the false detection of a user interaction.

Therefore, in some embodiments, in response to the supply voltage $V_S$ decreasing below the lowest magnitude voltage threshold $V_{TH-N}$, the processing circuitry/module 160 may be configured to ignore or disregard the output signal $V_{OUT}$. When the magnitude of the supply voltage $V_S$ decays below the $n^{th}$ voltage threshold value of N values, the bias voltage $V_{BIAS}$ may be configured at a corresponding $n^{th}$ bias voltage magnitude $V_{BIAS-N}$ of N bias voltage magnitudes. $V_{BIAS-N}$ biasing force sensor 130 may provide an output signal $V_{OUT}$ where even after a normalisation operation, the resulting normalised output signal $V_{OUT-NORM}$ may comprise a significant noise component.

Therefore, if such a "noisy" normalised output signal $V_{OUT-NORM}$ were provided to downstream processing circuitry/modules this could lead to a degraded user experience such as false positive detections of user activity. As such, when control module 140 determines that the magnitude of supply voltage $V_S$ has decreased below the $n^{th}$ voltage threshold value $V_{TH-N}$, the control module 140 may control processing module 160 to ignore or disregard the output signal $V_{OUT}$. The processing module 160 may therefore not apply a normalisation function to the output signal $V_{OUT}$ when the supply voltage $V_S$ has decayed below the $n^{th}$ voltage threshold value $V_{TH-N}$.

When the supply voltage $V_S$ has decayed below the $n^{th}$ voltage threshold value $V_{TH-N}$, it will be appreciated that various other circuits/modules, to which the supply voltage provides power may also not be operational. In one embodiment, circuitry 200 may be incorporated in an electronic device and the supply voltage $V_S$ may also power other components of the electronic device e.g. touchscreen, speaker, microphone etc. With the supply voltage decayed below the $n^{th}$ voltage threshold value $V_{TH-N}$, the supply voltage $V_S$ may not be providing enough power to reliably power any components of the electronic device. The power source from which the supply voltage is derived may therefore be considered "flat" and may not be able to power any components of the electronic device.

The above description has presented the disclosed aspects in the context of force sensors. However, the above disclosure is also applicable to any other type of sensor, which is biased by a bias voltage that is derived from a finite voltage source e.g. a battery, such as a MEMS transducer or a strain gauge, for example. However, the skilled person will understand that the present disclosure could be applicable for any other suitable sensor.

Figure 6:
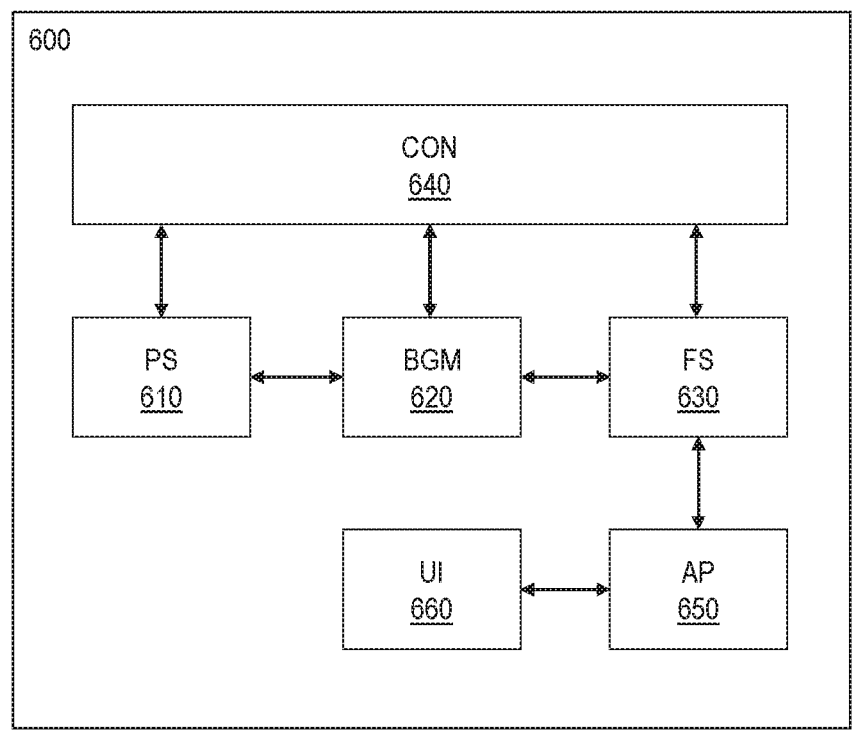
FIG. 6 illustrates an example of an electronic device according to an embodiment.

Embodiments of the present invention may be implemented in an electronic device, especially a portable and/or battery powered device. FIG. 6 illustrates an electronic device 600 comprising power source 610, a bias generator module 620, force sensors(s) 630 and control module 640. Control module 640 and bias generator module 620 may operate as described above, to bias forces sensor(s) 630. The force sensor(s) 630 may provide a user interface. The electronic device 600 may be a portable or battery powered device, for instance a tablet or laptop computer, or smartphone or smartwatch or the like, or a communications interface device such as a smart speaker or other smart listening device. Therefore, power source 610 may comprise a battery. The device could be a domestic appliance. The device may comprise an applications processor (AP) 650 and in some implementations the AP 650 may be operable to configure functionality from electronic device 600 in response to a detected user interaction from force sensor(s) 630. The device 600 may have at least one other user interface 660, e.g. for displaying an output to a user and in some applications the applications processor 650 may be operable to display an output via UI 660 in response to a detected user interaction from force sensor(s) 630.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for biasing a sensor comprising:
   a bias generator module configured to receive a supply voltage and to generate a bias voltage for biasing the sensor; and
   a control module configured to compare a voltage indicative of the supply voltage to a threshold voltage and to output a control signal to the bias generator module based on the comparison;
   wherein the bias generator module is configured to control the bias voltage based on the control signal.

2. Circuitry according to claim 1 wherein the bias generator module is operable to adjust the bias voltage from a first defined bias voltage magnitude to a second defined bias voltage magnitude based on the control signal.

3. Circuitry according to claim 2 wherein the second defined bias voltage magnitude is smaller than the first defined bias voltage magnitude and the control module is configured to output the control signal in response to the comparison being indicative that the magnitude of the supply voltage has decreased below the threshold voltage.

4. Circuitry according to claim 2 wherein the second defined bias voltage magnitude is larger than the first defined bias voltage magnitude and the control module is configured to output the control signal in response to the comparison being indicative that the magnitude of the supply voltage has increased above the threshold voltage.

5. Circuitry according to claim 4 wherein the control module is configured to apply a time delay prior outputting the control signal.

6. Circuitry according to claim 5 wherein the time delay is predetermined based on an expected rate of increase of the supply voltage magnitude.

7. Circuitry according to claim 1 wherein the control module is configured to monitor the supply voltage to determine whether the supply voltage magnitude is increasing or decreasing.

8. Circuitry according to claim 7 wherein the control module is configured to suspend the output of the control signal in response to the control module determining that the supply voltage magnitude is decreasing during a time delay.

9. Circuitry according to claim 8 wherein the control module is configured to not to output the control signal in response to the control module determining that the supply voltage has decreased below the voltage threshold during the time delay.

10. Circuitry according claim 7 wherein the control module is configured to select a value of the threshold voltage based on the determination of whether the supply voltage magnitude is increasing or decreasing.

11. Circuitry according to claim 10 wherein, in response to the control module determining that the supply voltage magnitude is decreasing, the control module is operative to select a first threshold voltage value.

12. Circuitry according to claim 11 wherein, in response to the control module determining that the supply voltage magnitude is increasing, the control module is operative to select a second threshold voltage value, wherein the second threshold voltage value is larger than the first threshold voltage value.

13. Circuitry according to claim 11 wherein, in response to the control module determining that the supply voltage magnitude is increasing, the control module is operative to select the first threshold voltage value.

14. Circuitry according to claim 1 wherein the control module is configured to select the value of the threshold voltage based on a magnitude of the supply voltage.

15. Circuitry according to claim 1 wherein the bias generator module is configured to generate the bias voltage at a plurality of defined bias voltage magnitudes.

16. Circuitry according to claim 15, further comprising a memory for storing a plurality of threshold voltage values corresponding to the plurality of defined bias voltage magnitudes and the control module is configured to select one of the threshold voltage values of the plurality to compare to the supply voltage, based on a magnitude of the supply voltage and a determination of whether the supply voltage magnitude is increasing or decreasing.

17. Circuitry according to claim 16 wherein the plurality of threshold voltage values are predetermined based on a dropout voltage of the bias generator module.

18. Circuitry according to claim 1 wherein the control module is configured to receive a signal indicative of the bias voltage.

19. Circuitry according to claim 18 wherein the control module is configured to select
a normalisation function based on the bias voltage,
the circuitry further comprising a processing module configured to receive an output signal from the sensor and further configured to receive the normalisation function from the control module; and
wherein the processing module is configured to apply the normalisation function to the output signal to generate a normalised output signal.

20. Circuitry according to claim 19, wherein the circuitry comprises a memory comprising a plurality of normalisation functions corresponding to the plurality of defined bias voltage magnitudes; and wherein the control module is configured to select one of the plurality of normalisation functions based on the bias voltage magnitude.

21. Circuitry according to claim 16, wherein the threshold voltage comprises the smallest magnitude value of the plurality of threshold voltage values; and wherein in response to the comparison being indicative that the supply voltage has decayed below the smallest magnitude value of the plurality of threshold voltage values, the control module is configured to control the processing module to not process the output signal.

22. Circuitry according to claim 1 wherein the control module comprises a hysteretic comparator configured to compare the supply voltage to the threshold voltage and output the control signal based on the comparison.

23. Circuitry according to claim 22 wherein the control signal comprises a latch signal.

24. Circuitry according to claim 1 wherein the sensor is a force sensor.

25. Circuitry according to claim 1 implemented as an integrated circuit.

26. A power supply unit comprising:
circuitry according to claim 1; and
a battery configured to output the supply voltage.

27. An electronic device comprising:
circuitry according to claim 1;
a battery configured to output the supply voltage; and
a sensor configured to receive the bias voltage.

28. An electronic device according to claim 27 wherein the electronic device comprises a portable or battery powered device.

29. An electronic device according to claim 28 wherein the electronic device is one of: a tablet, laptop computer, smartphone or smartwatch.

30. Circuitry for normalising an output signal of a force sensor comprising:
a bias generator module configured to receive a supply voltage and to generate a bias voltage for biasing the force sensor;
a control module configured to receive a voltage indicative of the bias voltage and select a normalisation function based on the bias voltage; and
a processing module configured to receive the output signal and the normalisation function;
wherein the processing module is further configured to apply the normalisation function to the output signal to normalise the output signal.

31. A sensor module comprising:
a sensor;
a bias generator configured to receive a supply voltage and to generate a bias voltage for biasing the sensor; and a controller configured to compare a signal voltage indicative of the supply voltage to a threshold voltage and to output a control signal to the bias generator based on the comparison;

wherein the bias generator is configured to control the bias voltage based on the control signal.

* * * * *

UNITED STATES PATENT AND TRADEMARK OFFICE
CERTIFICATE OF CORRECTION

| | |
|---|---|
| PATENT NO. | : 11,536,620 B2 |
| APPLICATION NO. | : 17/011500 |
| DATED | : December 27, 2022 |
| INVENTOR(S) | : Gavin McVeigh |

It is certified that error appears in the above-identified patent and that said Letters Patent is hereby corrected as shown below:

In the Claims

In Column 23, Line 11, in Claim 5, delete "prior" and insert -- prior to --, therefor.

In Column 23, Line 30, in Claim 10, delete "according" and insert -- according to --, therefor.

In Column 23, Lines 49-50, in Claim 14, delete "the value of the threshold voltage" and insert -- a value of the threshold voltage --, therefor.

In Column 24, Line 3, in Claim 19, delete "a normalisation function based on the bias voltage," and insert the same at Line 2 after "select" as a continuation sub-point.

In Column 24, Lines 14-15, in Claim 20, delete "the plurality of defined bias voltage magnitudes;" and insert -- a plurality of defined bias voltage magnitudes; --, therefor.

Signed and Sealed this
Ninth Day of May, 2023

Katherine Kelly Vidal
*Director of the United States Patent and Trademark Office*